United States Patent [19]
Imaizumi

[11] 3,767,486
[45] Oct. 23, 1973

[54] DOUBLE EPITAXIAL METHOD FOR FABRICATING COMPLEMENTARY INTEGRATED CIRCUIT

[75] Inventor: Ichiro Imaizumi, Tokyo, Japan

[73] Assignee: Hitachi, Ltd., Tokyo, Japan

[22] Filed: Mar. 20, 1972

[21] Appl. No.: 235,923

Related U.S. Application Data

[62] Division of Ser. No. 666,344, Sept. 8, 1967, abandoned.

[30] Foreign Application Priority Data

Sept. 9, 1966 Japan ............................... 41/59172

[52] U.S. Cl. ...................... 148/175, 29/576, 29/577, 29/578, 117/201, 117/213, 148/187, 148/191, 317/235 R

[51] Int. Cl. ......... H01l 7/00, H01l 7/44, H01l 19/00

[58] Field of Search .................... 148/174, 175, 187, 148/191; 29/576–578; 117/201, 213, 215; 317/234, 235

[56] References Cited

UNITED STATES PATENTS

| | | | |
|---|---|---|---|
| 3,370,995 | 2/1968 | Lowery et al. | 148/175 |
| 3,404,450 | 10/1968 | Karcher | 29/577 |
| 3,440,503 | 4/1969 | Gallagher et al. | 317/235 |
| 3,458,367 | 7/1969 | Yasufuku | 148/175 |
| 3,473,977 | 10/1969 | Skouson et al. | 148/175 |
| 3,481,801 | 12/1969 | Hugle | 148/175 |

OTHER PUBLICATIONS

Lin, H. C., "Semiconductor Integrated Circuit" Defensive Publ., Ser. No. 769,261, Publ. Apr. 29, 1969–861 O.G.1357

*Primary Examiner*—L. Dewayne Rutledge
*Assistant Examiner*—W. G. Saba
*Attorney*—Paul M. Craig, Jr. et al.

[57] ABSTRACT

A process for fabricating integrated circuit devices wherein a P type and N type epitaxial layer are successively formed on a P type semiconductor substrate having a high impurity concentration N type buried region at a predetermined surface portion, P type impurities are selectively diffused thru said N type layer to isolate portions of said N type layer with at least one isolated portion overlying said buried region, wherein during the thermal treatment for said diffusion, N type impurities outdiffusing from said buried region convert the overlying portion of said P type layer to N type. Subsequent selective diffusions are carried out to produce complementary devices.

7 Claims, 6 Drawing Figures

DOUBLE EPITAXIAL METHOD FOR FABRICATING COMPLEMENTARY INTEGRATED CIRCUIT

This application is a divisional of Ser. No. 666,344, filed Sept. 8, 1967, now abandoned.

BACKGROUND OF THE INVENTION

This invention relates to a semiconductor device, and more particularly it pertains to a semiconductor integrated circuit device having PNP type and NPN type transistor structures incorporated in a common semiconductor substrate.

In such a semiconductor integrated circuit device having a PNP transistor and an NPN type transistor incorporated in a common semiconductor substrate, for the convenience of fabrication, only one type of the transistors, for example, only the NPN transistor is so constructed as to be electrically independent of the semiconductor substrate, while the other type of transistor namely the PNP type one is so constructed as to enable the semiconductor substrate to serve as the collector region thereof so that it is electrically coupled to the substrate.

More specifically, in a semiconductor integrated circuit device having such construction as described above, the NPN type transistor structure thereof is such that an N type epitaxial layer is provided on the surface of a semiconductor substrate which is normally of P conductivity type, a portion of this expitaxial layer is surrounded by a PN junction so as to form at least one N type separated surface region which is separated from the remaining portion of the epitaxial layer, the N type separated surface region serves as the collector region, a P type surface diffused region formed by initially diffusing a P type impurity into the surface portion of the N type separated surface region serves as the base region, and an N type surface diffused region formed by diffusing an N type impurity into the surface portion of the base region serves as the emitter region. In the PNP type transistor structure, on the other hand, the P type semiconductor substrate serves as the collector region, the epitaxial layer except for the separated surface region formed on the substrate serves as the base region, and a P type surface diffused region simultaneously formed by the initial diffusion of the P type impurity serves as the emitter region.

In this case, the N type separated surface region is formed by an epitaxial layer with a low impurity concentration and a relatively high resistance, as described. Therefore in the NPN type transistor using this N type separated surface region as the collector region thereof, it is required that an N type buried region with a high impurity concentration be formed in that predetermined surface portion of the semiconductor substrate on which is formed the N type separated surface region in such a manner that it is disposed in contact with the bottom surface of the N type separated surface region, normally for the purpose of decreasing the equivalent resistance of the collector. In this case, it is desired that the buried region should be as stably positioned as possible. Therefore, such buried region should normally be formed by an impurity capable of representing a low diffusion constant and a high impurity concentration. For this reason, arsenic is used as buried impurity. Thus, such buried region is formed in a predetermined surface portion of the semiconductor substrate by diffusing arsenic thereinto, and thereafter an epitaxial layer is formed which is to constitute the N type separated surface region.

However, in an attempt to fabricate a semiconductor integrated circuit device as described above, heat treatment is required for such purposes as the formation of the epitaxial layer and an oxide layer, diffusion of impurities or the like, and therefore diffusion of the buried impurity contained in the buried region is inevitably effected during such heat treatment, with the result that a highly concentrated region of the buried impurity with a thickness of about 2 to 3 $\mu$ is formed in the N type separated surface region disposed in contact with the buried region. Therefore, if the base region of the NPN type transistor is made too deep, there may occur the trouble that the base-collector junction surface is caused to be in contact with the highly concentrated region so that the breakdown voltage of the transistor is decreased. This means that a certain limitation is imposed upon the base width of the PNP type transistor of which the emitter region is formed by the P type surface diffused region formed simultaneously with the base region of the NPN transistor through the impurity diffusion with respect to the latter.

Thus, in a conventional semiconductor integrated circuit device, especially a PNP transistor with a small base width could not be fabricated, which led to inconveniences in respect of circuit design.

Accordingly, it is a primary object of the present invention to minimize the base width of a transistor structure incorporated in such a semiconductor integrated circuit device, wherein the collector region is constituted by the semiconductor substrate of the integrated circuit device, and the base region is formed by an epitaxial layer formed on the semiconductor substrate.

Another object of this invention is to provide a semiconductor integrated circuit structure adapted for facilitating the separation diffusion of an impurity which is effected from the surface of an epitaxial layer so as to form a separated region in part of the epitaxial layer.

The foregoing and other objects, features and advantages of the present invention will become apparent from the following description taken in conjunction with the accompanying drawings.

BRIEF DESCRIPTION OF DRAWINGS

FIGS. 1 through 6 are cross sectional views illustrating an embodiment of the present invention, in the order of the steps of fabrication thereof, respectively.

DESCRIPTION OF PREFERRED EMBODIMENT

Figure 1:
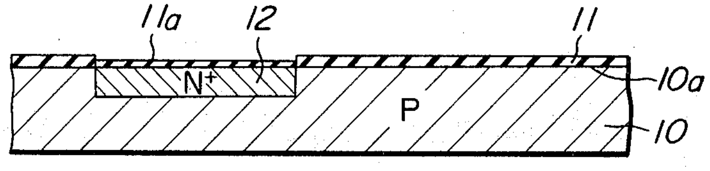

Referring to FIG. 1 of the drawings, the reference numeral 10 represents a monocrystalline silicon substrate of P conductivity type which is a silicon wafer 200 to 250 $\mu$ in thickness with an impurity concentration of $10^{15}$ $cm^{-3}$, a resistivity of 5 to 10 cm and having a silicon dioxide film 11 about 8,000 A in thickness previously formed on a surface **10*a*** thereof.

In FIG. 1, there is shown the state in which an N type region 12 is formed by diffusion of arsenic, which is a donor impurity, through a hole formed by removing a predetermined portion **11*a* of the oxide film 11. The N type region 12 is intended to serve as a buried region which has a high impurity concentration as indicated by $N^+$in the drawing. The surface impurity concentration of the N type region 12** is $10^{19}$ to $10^{20}$ $cm^{-3}$, and the thickness thereof is about 4 $\mu$.

Figure 2:
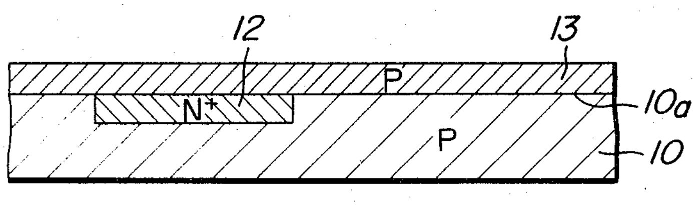
Figure 3:
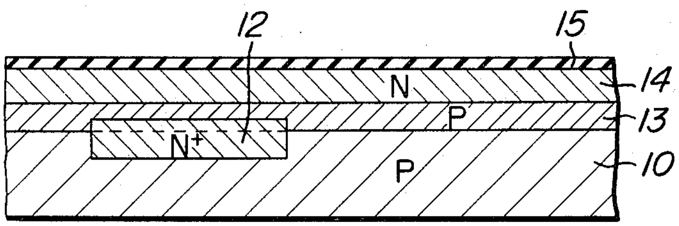
Figure 4:
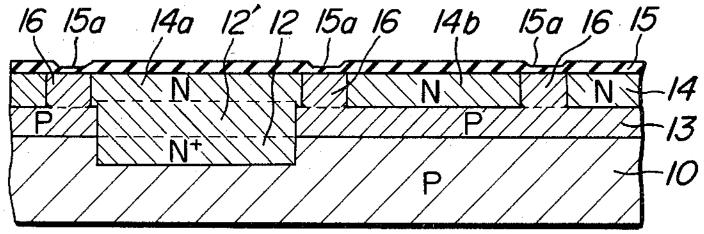
Figure 4:
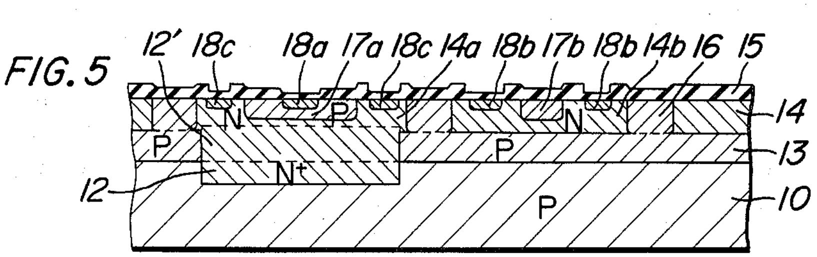
Figure 4:
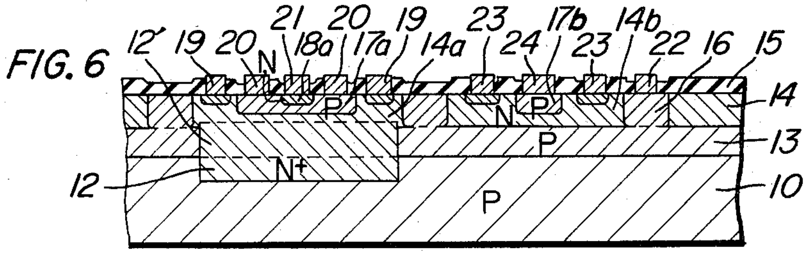

In accordance with the present invention, the oxide film 11 is thereafter completely removed, and a P type epitaxial layer 13 with a resistivity of about 1 Ω. cm and a thickness of about 3 to 4 μ is first formed on the surface 10a of the semiconductor substrate 10 as shown in FIG. 2. Subsequently, an N type epitaxial layer 14 with a resistivity of 0.1 Ω. cm and a thickness of about 2 μ is formed on the surface of the P type epitaxial layer 13. The N type epitaxial layer 14 has its surface covered with a silicon dioxide film 15. In order to form these epitaxial layers, use is made of the well-known vapor phase growing technique. For example, the P type layer 13 can be formed by heating the silicon substrate 10 at 1,200°C. for about two minutes in an atmosphere of silicon tetrachloride ($SiCl_4$) and hydrogen gas doped with boron which is an acceptor impurity. The N type layer 14 can be formed by heating the silicon substrate 10 at 1,200°C. for 1 minute, using phosphorus, which is a donor impurity, instead of boron. The P type epitaxial layer 13 is of such a thickness as to enable the impurity or arsenic contained in the N type buried region 12 to be diffused therethrough to reach the N type epitaxial layer 14. On the other hand, the N type epitaxial layer 14 is of a sufficient thickness to produce through double diffusion of impurities a transistor structure wherein this epitaxial layer serves as the collector thereof. When the silicon dioxide film 15 is formed, the silicon substrate is heated at 1,150°C. for an hour or longer, with the result that at this stage, the N type buried region 12 is caused to extend into the P type epitaxial layer 14 to some extent, as shown in FIG. 3. This impurity diffusion from the N type buried region 12 is caused to further progress by the heating for the P type impurity diffusion to form N type separated surface regions 14a and 14b, as shown in FIG. 4, with the result that there is formed an N type inversion region 12' which substantially penetrates through the P type epitaxial layer 13.

Such separation diffusion of the P type impurity is effected by previously depositing boron on that exposed surface portion of the N type epitaxial layer 14 where the portion 15a of the oxide film 15 has been removed with the semiconductor structure heated at 1,150°C. for 40 minutes and a mixed gas of boron tribromide ($BBr_3$), nitrogen ($N_2$) and oxygen ($O_2$) being supplied thereto, and further heating the semiconductor structure at 1,100°C. for an hour or longer to cause the deposited boron to be diffused through the P type epitaxial layer 13. Thus, portions 14a and 14b of the N type epitaxial layer are surrounded by a P type separating region 16 so formed as to penetrate through the N type epitaxial layer 14 so as to form N type separated surface regions. One of the N type separated surface regions or 14a has its bottom surface disposed in contact with the N type buried region 12 through the N type inversion region 12'. Thereafter, a surface diffused region 17a is formed in the surface portion of the N type separated surface region 14a by diffusing a P type impurity thereinto, and a surface diffused region 18a is formed in the surface portion of the region 17a by diffusing an N type impurity thereinto. In this way, there is fabricated an NPN type transistor structure in which the N type separated surface region 14a serves as collector region, the P type surface diffused region 17a as base region, and the N type surface diffused region 18a as emitter region.

Furthermore, a P type surface diffused region 17b is formed in the surface portion of the other N type separated surface region 14b simultaneously with the P type surface diffused region 17a during the same step of impurity diffusion. Thus, there is produced a PNP type transistor in which the silicon substrate 10 and P type epitaxial layer 13 serve as collector region, the N type separated surface region 14b as base region, and the P type surface diffused region 17b as emitter region.

The base region 17a of the NPN type transistor and the emitter region 17b of the PNP type transistor are formed by selective diffusion of boron through the use of the oxide film 15 as mask. By selecting the depth of boron diffusion to be 1.5 μ, a PNP transistor with a base width of about 0.5 μ can be obtained. Even during the step of such impurity diffusion, diffusion of the buried impurity from said buried region 12 is caused so that the N type inversion region 12' will be completely coupled to the bottom portion of the N type separated surface region 14a.

The N type surface diffused region 18a using phosphorus as impurity is formed at a depth of 1 to 1.2 μ. Thus, the NPN type transistor will possess a base width of 0.3 to 0.5 μ.

As a result of the N type impurity diffusion, N type impurity diffused regions 18b and 18c are simultaneously formed in predetermined surface portions of the N type separated surface regions 14a and 14b composed of the epitaxial layer, and these regions 18b and 18c are utilized respectively to decrease the resistance resulting from attaching the base electrode to the PNP type transistor and the collector electrode to the NPN type transistor.

FIG. 6 shows the state wherein ohmic electrode terminals 19, 20, 21, 22, 23 and 24 are attached to the respective conductivity type regions of the NPN type transistor and PNP type transistor by evaporating aluminum thereonto.

In the resultant semiconductor device structure of this invention, the NPN transistor incorporated therein comprises the buried region 12 doped with the N type impurity with a high concentration to decrease the equivalent resistance of the collector region, wherein the buried region 12 is connected with the N type epitaxial layer serving as the collector region 14a through the N type inversion region 12' formed as a result of the reversal of the conductivity type of the P type epitaxial layer 13 in contact with the buried region 12 caused by the diffusion of the buried region 12 into the P type epitaxial layer 13. Consequently, the extension of the N type buried region into the N type epitaxial layer becomes small, as compared with that in the conventional device. Thus, by controlling the depth of impurity diffusion during the formation of the P type surface diffused regions 17a and 17b, it is possible to make the base width of the PNP type transistor incorporated in the device of this invention as thin as about 0.5 to 1.0 μ in range so that the P type surface diffused region 17a of the NPN type transistor is prevented from being disposed in contact with the upper end of the N type inversion region 12'.

Furthermore, with the structure of the present invention, the thickness of the N type epitaxial layer 14 can be reduced by an amount corresponding to the thickness of the P type epitaxial layer 13, as compared with that of the conventional structure. Thus, the structure according to this invention has the advantage that the depth of diffusion with respect to the separating diffusion region 16 can be small so that the period of time required for such impurity diffusion can be shortened.

As described above, in accordance with the present invention, any adverse effect produced by diffusing the buried impurity from the buried region with a high impurity density which is buried in the surface portion of the semiconductor substrate for the purpose of decreasing the equivalent resistance of the collector into the adjacent epitaxial layer can effectively be eliminated by interposing another epitaxial layer between the substrate and the epitaxial layer.

While this invention has been illustrated and described with respect to a specific embodiment thereof, it is to be understood that the invention is not restricted to such specific embodiment. It will readily occur to those skilled in the art that this invention can equally be applied to a semiconductor integrated circuit structure using an N type semiconductor substrate.

I claim:

1. A method for forming at least one isolation region in a semiconductor substrate comprising:

a. preparing a semiconductor substrate of a first conductivity type having a major face;

b. forming a semiconductive buried region of a second conductivity type opposite to the first conductivity type and having a high impurity concentration in said substrate adjacent to the major surface thereof at a predetermined zone;

c. epitaxially growing a first semiconductive epitaxial layer of the first conductivity type on the major face of said substrate;

d. epitaxially growing a second semiconductive epitaxial layer of the second conductivity type on said first epitaxial layer; and e. forming at least one semiconductive separating region of the first conductivity type by diffusing an impurity through said second epitaxial layer to said first epitaxial layer so as to divide said second epitaxial layer into at least a first and a second separated regions, wherein the impurity of said buried region is diffused through said first epitaxial layer into said second epitaxial layer so as to form an inversion region of the second conductivity type in said first epitaxial layer, said first separated region being formed so as to overlie said inversion region.

2. A method for making a semiconductor integrated circuit device comprising:

a. preparing a semiconductor substrate of a first conductivity type having a major face;

b. forming a semiconductive buried region of a second conductivity type opposite to the first conductivity type having a high impurity concentration in said substrate adjacent to the major surface thereof at a predetermined zone;

c. epitaxially growing a first semiconductive epitaxial layer of the first conductivity type on the major face of said substrate;

d. epitaxially growing a second semiconductive epitaxial layer of the second conductivity type on said first epitaxial layer;

e. forming at least one semiconductive separating region of the first conductivity type by diffusing an impurity through said second epitaxial layer to reach said first epitaxial layer so as to divide said second epitaxial layer into at least a first and a second separated regions, wherein the impurity of said buried region is diffused through said first epitaxial layer into said second epitaxial layer so as to form an inversion region of the second conductivity type in said first epitaxial layer, said first separated region being formed so as to overlie said inversion region;

f. forming a first surface diffused region of the first conductivity type in said first separated region;

g. forming a second surface diffused region of the second conductivity type in said first surface diffused region thereby forming a first transistor structure with said first separated region and said first and second surface diffused regions functioning respectively as the collector, base and emitter; and h. forming a third surface diffused region of the first conductivity type in said second separated region thereby forming a second transistor structure different in type from that of said first transistor structure with said substrate, said second separated region and said third surface diffused region serving respectively as the collector, base and emitter.

3. A method for making a semiconductor integrated circuit device according to claim 2, wherein said first and third surface diffused regions of the first conductivity type are diffused simultaneously during the same heat treatment in said first and second separated regions, respectively.

4. A method for forming at least one separated semiconductive single crystal region having a high impurity concentration region at the bottom thereof, comprising:

a. preparing a semiconductor substrate of a first conductivity type having a major face;

b. forming a semiconductive buried region of a second conductivity type opposite to the first conductivity type containing an impurity of the second conductivity type with a high impurity concentration in said substrate adjoining the major face thereof in a predetermined area;

c. growing a first semiconductive single crystal layer of the first conductivity type on the major face of said substrate so as to overlie said buried region;

d. growing a second semiconductive single crystal layer of the second conductivity type on said first layer; and e. diffusing an impurity of the first conductivity type into said second layer from the upper face thereof so as to pass therethrough and to reach said first layer by a thermal treatment during which the impurity of the second conductivity type contained in said buried region is concurrently diffused into said layer from the bottom thereof so as to pass therethrough and to reach said second layer, the impurity of the first conductivity type diffused into said second layer forming a separating inversion region of the first conductivity type for separating from said second layer a separated region thereof to which said buried region is integrally connected by an inversion region which is formed with the impurity diffused into said first layer from said buried region.

5. A method for making a transistor comprising the steps of:

a. preparing a semiconductor substrate of a first conductivity type having a major face;

b. forming a semiconductive buried region of a second conductivity type opposite to the first conductivity type containing an impurity of the second conductivity type with a high impurity concentration in said substrate adjoining the major face thereof;

c. growing a first semiconductive single crystal layer of the first conductivity type having a low impurity concentration on the major face of said substrate so as to overlie said buried region;

d. growing a second semiconductive single crystal layer of the second conductivity type on said first layer;

e. diffusing an impurity of the first conductivity type into said second layer from the upper face thereof through said first layer so as to form therewith a separating region of the first conductivity type and to reach said first layer by a thermal treatment during which the impurity of the second conductivity type contained in said buried region is concurrenjly diffused into said first layer from the bottom thereof so as to form an inversion region of the second conductivity type through said first layer and to reach said second layer, said separating region separating from said second layer a separated region thereof and said inversion region integrally connecting said buried region to said separated region;

f. forming a first surface region of the first conductivity type in said separated region; and g. forming a second surface region of the second conductivity type in said first surface region to thereby form a transistor structure with said separated region and said first and second surface regions functioning, respectively, as collector, base and emitter.

6. A method for making complementary transistors comprising the steps of:

a. preparing a semiconductor substrate of a first conductivity type having a major face;

b. forming a semiconductive buried region of a second conductivity type opposite to the first conductivity type having a high impurity concentration in said substrate adjoining the major face thereof;

c. growing a first semiconductive single crystal layer of the first conductivity type having a low impurity concentration on the major face of said substrate so as to overlie said buried region;

d. growing a second semiconductive single crystal layer of the second conductivity type on said first layer;

e. forming a semiconductive separating region of the first conductivity type in said second layer by diffusing an impurity into said second layer so as to extend through said second layer from the upper face thereof to said first layer and to thereby divide said second layer into a first separated region overlying said buried region and a second separated region;

f. forming a first semiconductive surface region of the first conductivity type in said first separated region;

g. forming a secnd semiconductor surface region of the second conductivity type in said first surface region to thereby form a first transistor structure with said first separated region and said first and second surface regions functioning, respectively, as collector, base and emitter; and h. forming a third semiconductor surface region of the first conductivity type in said second separated region to thereby form a second transistor structure different in type from that of said first transistor structure with said substrate as well as said first layer, said second separated region and said third surface region functioning, respectively, as collector, base and emitter;

a portion of the impurity of the second conductivity type contained in said buried region being extended through said first layer and reaching said first separated region during the step of forming said separating region to thereby form an inversion region of the second conductivity type through said first layer.

7. A method for making complementary transistors according to claim 6, wherein said first and third surface regions of the first conductivity type are formed in said first and second separated regions, respectively, during the same thermal treatment for forming the same, to thereby give to said first and third surface regions substantially the same thickness.

* * * * *